United States Patent
Xiao

(10) Patent No.: US 9,793,285 B2
(45) Date of Patent: Oct. 17, 2017

(54) METAL-ONO-VACUUM TUBE CHARGE TRAP FLASH (VTCTF) NONVOLATILE MEMORY AND THE METHOD FOR MAKING THE SAME

(71) Applicant: ZING SEMICONDUCTOR CORPORATION, Shanghai (CN)

(72) Inventor: Deyuan Xiao, Shanghai (CN)

(73) Assignee: ZING SEMICONDUCTOR CORPORATION, Shanghai (CN)

( * ) Notice: Subject to any disclaimer, the term of this patent is extended or adjusted under 35 U.S.C. 154(b) by 0 days.

(21) Appl. No.: 15/202,418

(22) Filed: Jul. 5, 2016

(65) Prior Publication Data
US 2017/0256557 A1    Sep. 7, 2017

(30) Foreign Application Priority Data
Mar. 3, 2016    (CN) .......................... 2016 1 0120869

(51) Int. Cl.
*H01L 29/66*    (2006.01)
*H01L 27/11568*    (2017.01)
*H01L 29/792*    (2006.01)
*H01L 21/28*    (2006.01)
*H01L 21/324*    (2006.01)

(52) U.S. Cl.
CPC .. *H01L 27/11568* (2013.01); *H01L 21/28282* (2013.01); *H01L 21/324* (2013.01); *H01L 29/66833* (2013.01); *H01L 29/792* (2013.01)

(58) Field of Classification Search
None
See application file for complete search history.

(56) References Cited

U.S. PATENT DOCUMENTS

| | | | |
|---|---|---|---|
| 2005/0199956 A1* | 9/2005 | Ding | ...................... H01L 27/115 |
| | | | 257/365 |
| 2011/0058418 A1* | 3/2011 | Choi | ................... G11C 16/0466 |
| | | | 365/185.05 |

* cited by examiner

*Primary Examiner* — Thao P Le
(74) *Attorney, Agent, or Firm* — Huffman Law Group, PC

(57) ABSTRACT

The present invention relates to a method for preparing vacuum tube flash memory structure, to form a vacuum channel in the flash memory, and using oxide-nitride-oxide (ONO) composite materials as gate dielectric layer, wherein the nitride layer serves as a charge-trap layer to provide a blocking insulating between the gate electrode and the vacuum channel. The present structure exhibits superior program and erase speed as well as the retention time. It also provide with excellent gate controllability and negligible gate leakage current due to adoption ONO as the gate dielectric layer.

9 Claims, 8 Drawing Sheets

METAL-ONO-VACUUM TUBE CHARGE TRAP FLASH (VTCTF) NONVOLATILE MEMORY AND THE METHOD FOR MAKING THE SAME

INCORPORATION BY REFERENCE

This application claims priority from P.R.C. Patent Application No. 201610120869.9, filed on Mar. 3, 2016, the contents of which are hereby incorporated by reference in their entirety for all purposes.

TECHNICAL FIELD

The present invention relates to a semiconductor manufacturing process, and particularly, relates to a vacuum tube nonvolatile memory and the method of manufacturing it.

BACKGROUND

A vacuum tube is a type of electronic device that is usually sealed in a vacuum box to control the flow of electrons. In early 20th century, almost all of the electronic devices were made of vacuum tubes. However, the vacuum tubes have the drawbacks of high cost, short lifetime, big volume and low performance, They were largely replaced by solid state devices during the 1960s and 1970s. Only instruments that need high performance such as audio amplifiers, microwave stove, satellite transponders or even some of the fighter aircraft applications are still using vacuum tubes. Please refer to FIG. 1, it shows the circuit diagram of the conventional vacuum tube "Triode", which includes a grid 1, plate 3, emitter 2 and filament 5. This additional control grid 1 modulates the current that flows from emitter 2 to plate 3.

Early electronics centered around the vacuum tube used to amplify, switch, or modulate electrical signals. It has been many decades since the vacuum tubes have been replaced by solid-state devices such as the MOSFET and BJT and diodes.

The vacuum tubes are still used in niche applications such as premier sound systems and high-power radio base stations. The transition from the vacuum tube to the solid-state device was not driven by the superiority of the semiconductor as a carrier transport medium but by the ease of fabrication, low cost, low-power consumption, lightness, long lifetime, and ideal form factor for integrated circuits.

The vacuum device is more robust than solid-state devices in extreme environments involving high temperature and exposure to various radiations.

The critical tradeoff is that the vacuum tubes yield higher frequency/power output but consume more energy than the MOSFET.

The vacuum is intrinsically superior to the solid as carrier transport, medium since it allows ballistic transport while the carriers suffer from optical and acoustic phonon scattering in semiconductors. The velocity of electrons in vacuum is theoretically $3\times10^{10}$ cm/s, but is limited to about $5\times10^{7}$ cm/s in semiconductors.

SUMMARY

The present invention provides a vacuum tube nonvolatile memory and the method of manufacturing it. The present structure exhibits superior program and erase speed as well as the retention time. It also provides with excellent gate controllability and negligible gate leakage current due to adoption of the gate insulator.

In order to achieve the above advantages, an object of the present invention is to provide a method of forming a vacuum tube nonvolatile memory. The method comprises the steps of providing a substrate, sequentially forming a dielectric layer, a source layer, a second dielectric layer, a gate layer and a hard mask layer on the substrate, patterning the second dielectric layer, the gate layer and the hard mask layer to form a gate structure, trimming the second dielectric layer, the gate layer of the gate structure to make the width of the second dielectric layer and the gate layer smaller than the width of the hard mask layer, forming a gate dielectric layer on the substrate, and performing etching to form gate dielectric layer sidewalls, forming a gate on the dielectric layer, forming a drain layer, and forming an interlayer dielectric layer and performing planarization to from a vacuum channel.

In one embodiment, the method further comprises a step of annealing the source layer and the drain layer.

In one embodiment, annealing is performed in the environment of He, $N_2$, Ar or $H_2$.

In one embodiment, annealing is performed in the temperature range of 600~1000° C.

In one embodiment, the pressure in the vacuum channel is in the range of 0.1 torr~50 torr.

In one embodiment, the source layer and the drain layer are the metal materials selected from the group consisting of Zr, V, Nb, Ta, Cr, Mo, W, Fe, Co, Pd, Cu, Al, Ga, In, Ti, TiN, TaN, diamond and the combination of these materials.

In one embodiment, the gate layer is the metal materials comprising Al, poly Si, Cu, Ga, In, Ti, Ta, W, Co, TiN, TaN, or the combination of these materials.

In one embodiment, the gate dielectric layer is the metal materials comprising oxide, oxynitride, silicon nitride, $Al_2O_3$, AlN and HfO.

In one embodiment, the hard mask layer is the metal materials comprising oxynitride, silicon nitride, and TiN.

An object of the present invention is also to provide a vacuum tube nonvolatile memory. The vacuum tube nonvolatile memory comprises a substrate, a first dielectric layer and a source layer on the substrate, a gate structure on the source layer, wherein the gate structure comprises a gate layer and a hard mask layer, a gate dielectric layer located on sidewalls of the gate structure, and a vacuum channel, wherein the width of the second dielectric layer and the gate layer smaller than the width of the hard mask layer, and a drain layer on the gate structure and seal the vacuum channel.

BRIEF DESCRIPTION OF THE DRAWINGS

Exemplary embodiments will be more readily understood from the following detailed description when read in conjunction with the appended drawing, in which.

DETAILED DESCRIPTION

The following detailed description in conjunction with the drawings of a vacuum tube nonvolatile memory and fabrication method thereof of the present invention represents the preferred embodiments. It should be understood that the skilled in the art can modify the present invention described herein to achieve advantageous effect of the present invention. Therefore, the following description should be understood as well known for the skilled in the art, but should not be considered as a limitation to the present invention.

For purpose of clarity, not all features of an actual embodiment are described. It may not describe the well-known functions as well as structures in detail to avoid confusion caused by unnecessary details. It should be considered that, in the developments of any actual embodiment, a large number of practice details must be made to achieve the specific goals of the developer, for example, according to the requirements or the constraints of the system or the commercials, one embodiment is changed to another. In addition, it should be considered that such a development effort might be complex and time-consuming, but for a person having ordinary skills in the art is merely routine work.

Figure 1:
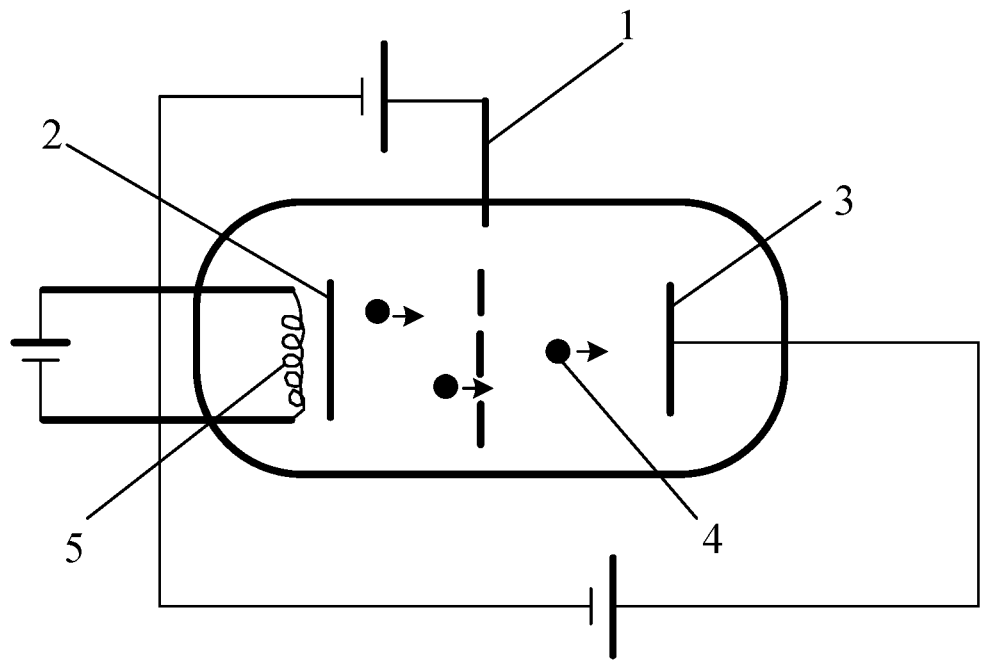
FIG. 1 is a schematic diagram showing a conventional vacuum tube structure.
Figure 2:
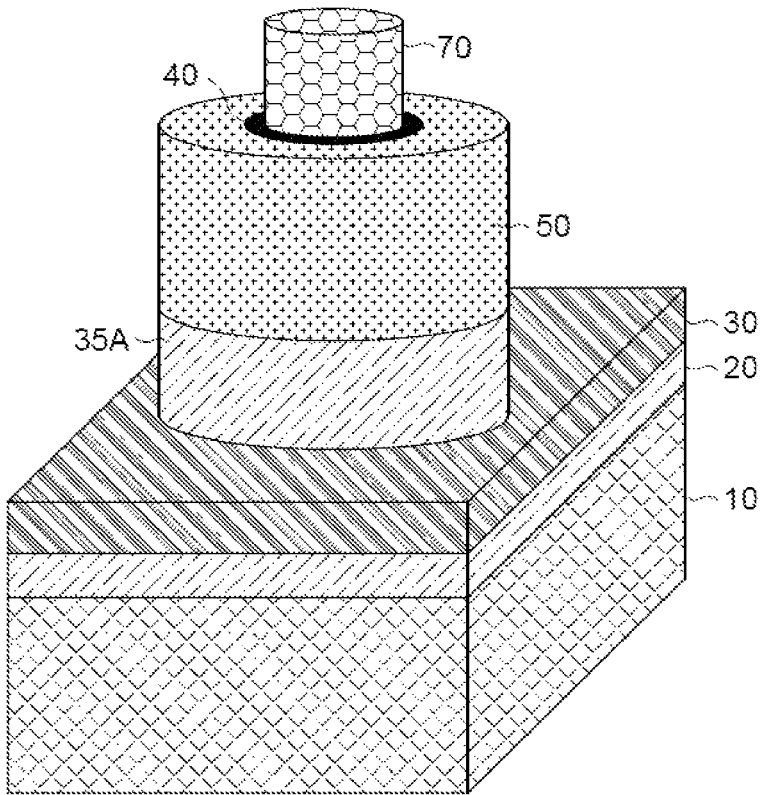
FIG. 2 illustrates an example cross-sectional view of a vacuum tube nonvolatile memory according to an example embodiment of the present invention.
Figure 3:
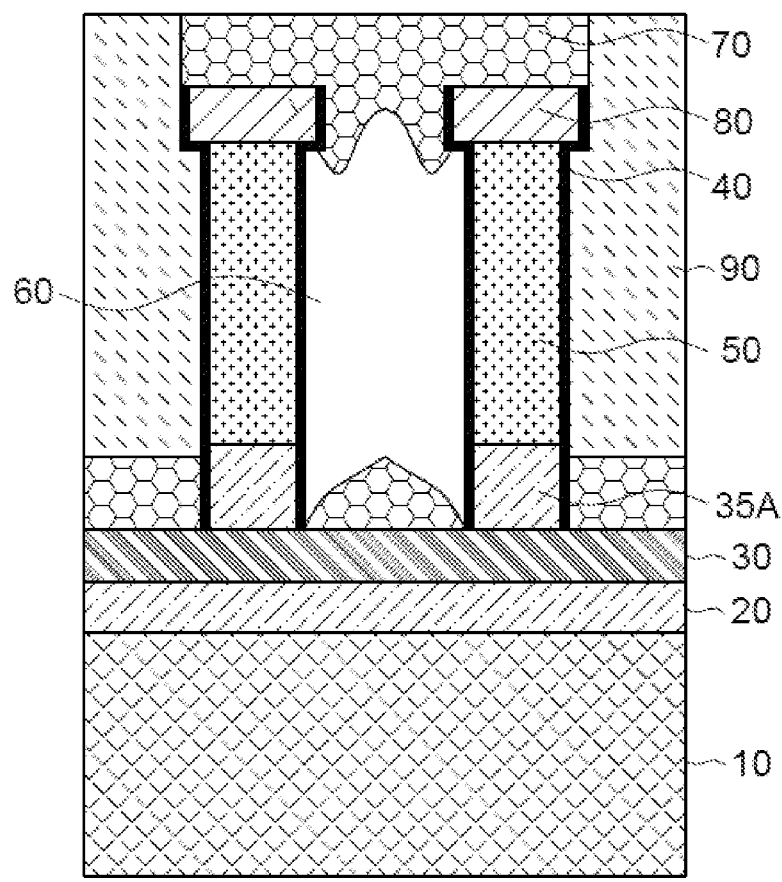
FIG. 3 is a cross-sectional view along the A-A' direction according to one embodiment of the present invention.
Figure 4:
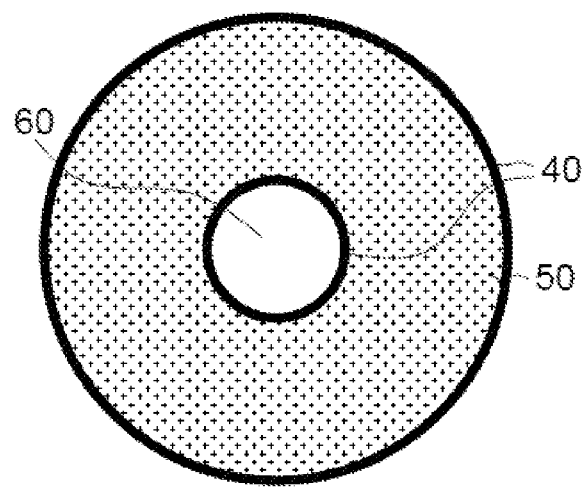
FIG. 4 is a cross-sectional view along the B-B' direction according to one embodiment of the present invention.

In the following paragraphs, the accompanying drawings are referred to, to describe the present invention more specifically by way of example. The advantages and the features of the present invention are more apparent according to the following description and claims. It should be noted that the drawings are in a simplified form with non-precise ratio for the purpose of assistance to conveniently and clearly explain an embodiment of the present invention. Reference is now made to FIGS. 2-4, which illustrate an example cross-sectional view of a vacuum tube nonvolatile memory according to an example embodiment of the present invention.

The vacuum tube nonvolatile memory includes a substrate 10, a dielectric layer 20, a source layer 30, a gate dielectric layer 40, a gate 50, a drain layer 70, a hard mask layer 80 and an interlayer dielectric layer (ILD) 90. As shown in the Figures, the dielectric layer 20 is on the substrate 10, the source layer 30, gate dielectric layer 40, gate 50, drain layer 70 are on the dielectric layer 20, and the source layer 30, and drain layer 70 located on each side of the gate 50 respectively. The gate 50 comprises a vacuum region 60 to expose the sidewalls of the source layer 30, and drain layer 70. A gate dielectric layer 40 is formed on the sidewalls of the vacuum area 60.

Figure 5:
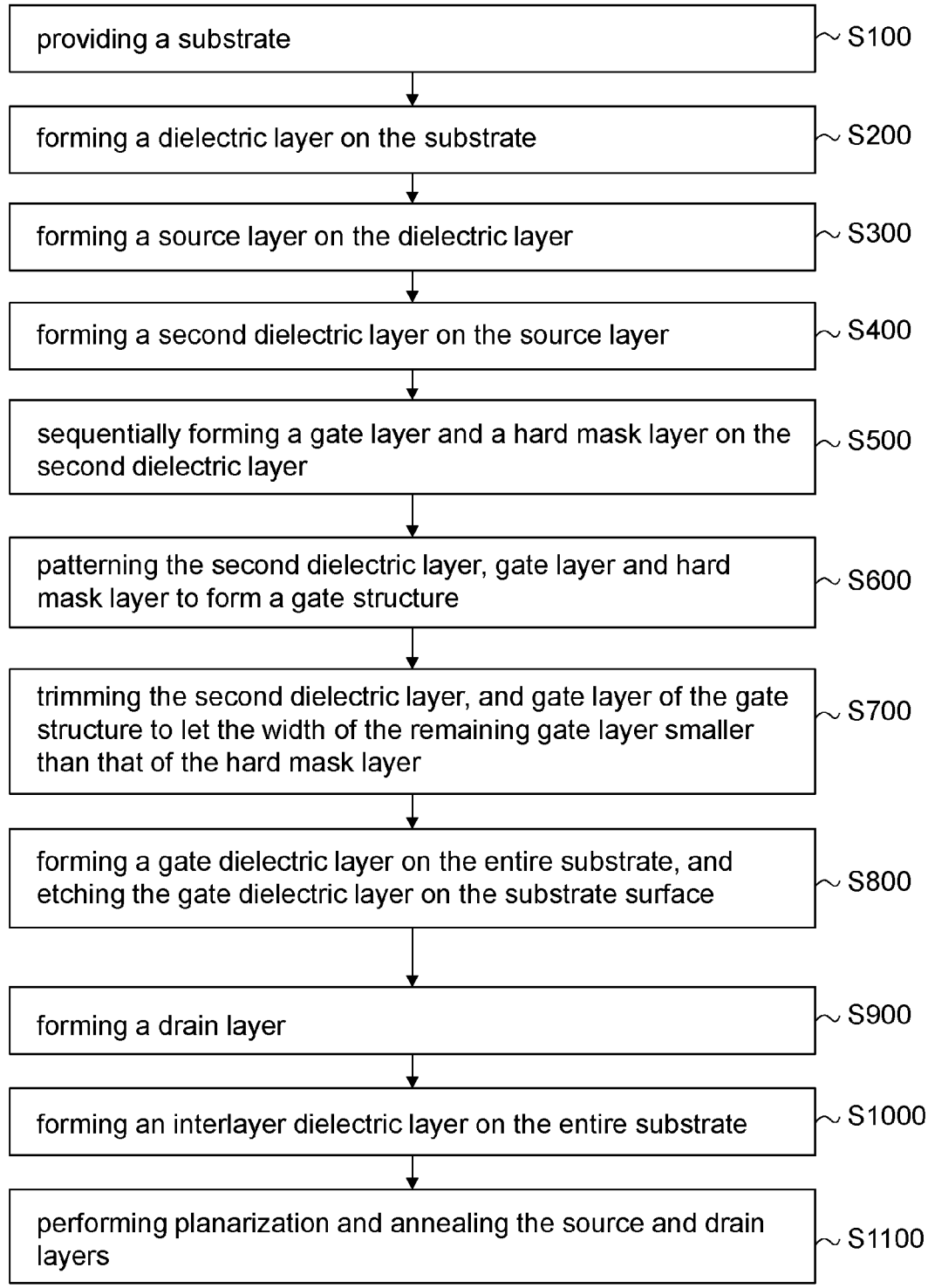
FIG. 5 is a flow chart of a fabrication method of a vacuum tube nonvolatile memory according to one embodiment of the present invention.
Figure 6:
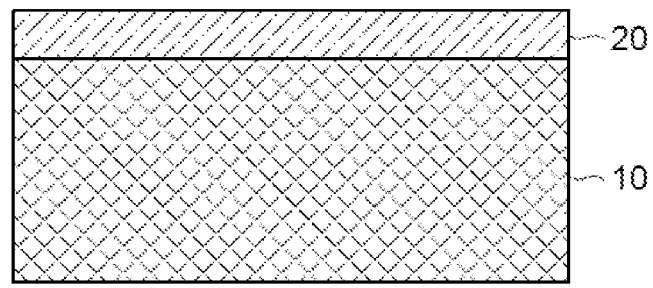
FIGS. 6~14 are cross-sectional views showing process stages of manufacturing a vacuum tube nonvolatile memory according to one embodiment of the present invention.

Please refer to FIG. 5, it illustrates a flow chart of manufacturing a vacuum tube nonvolatile memory according to an example embodiment of the present invention. The method includes the steps of:

S100: providing a substrate;
S200: forming a dielectric layer on the substrate;
S300: forming a source layer on the dielectric layer;
S400: forming a second dielectric layer on the source layer;
S500: sequentially forming a gate layer and a hard mask layer on the second dielectric layer;
S600: patterning the second dielectric layer, gate layer and hard mask layer to form a gate structure;
S700: trimming the second dielectric layer, and gate layer of the gate structure to let the width of the remaining gate layer smaller than that of the hard mask layer;
S800: forming a gate dielectric layer on the entire substrate, and etching the gate dielectric layer on the substrate surface;
S900: forming a drain layer;
S1000: forming an interlayer dielectric layer on the entire substrate; and
S1100: performing planarization and annealing the source and drain layers.

In particular, please refer to the following FIGS. 6~14 for the manufacturing process details. Now, refer to FIG. 6, it illustrates the cross-sectional view after the first step of manufacturing the vacuum tube nonvolatile memory according to an example embodiment of the present invention. A dielectric layer 20 is formed on a substrate 10. In one embodiment, the substrate 10 can be a silicon wafer, a silicon on insulator (SOI) substrate or the like. The dielectric layer 20 is silicon dioxide.

Figure 7:
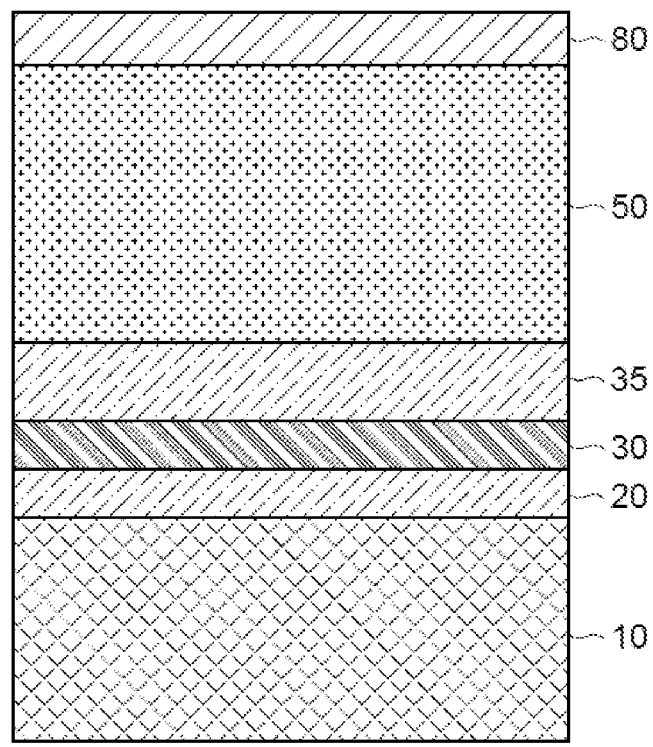

Next, refer to FIG. 7, it illustrates the cross-sectional view after the second step of manufacturing the vacuum tube nonvolatile memory according to an example embodiment of the present invention. A source layer 30, a second dielectric layer 35, a gate layer 50 and a hard mask layer 80 are sequentially formed on the dielectric layer 20. In one embodiment, the source layer 30 is the metal materials include Zr, V, Nb, Ta, Cr, Mo, W, Fe, Co, Pd, Cu, Al, Ga, In, Ti, TiN, TaN, diamond or the combination of these materials. In one embodiment, the source layer is deposited by CVD, MOCVD, PVD techniques technologies. The second dielectric layer 35 is also silicon dioxide. In one embodiment, the gate layer 50 is a metal gate layer s deposited by CVD, MOCVD, PVD technologies. The gate layer 50 is the metal materials include Al, poly Si, Cu, Ga, In, Ti, Ta, W, Co, TiN, TaN, or the combination of these materials. In one embodiment, the hard mask layer 80 is oxynitride, silicon nitride or TiN, deposited by CVD, MOCVD, ALD technologies.

Figure 8:
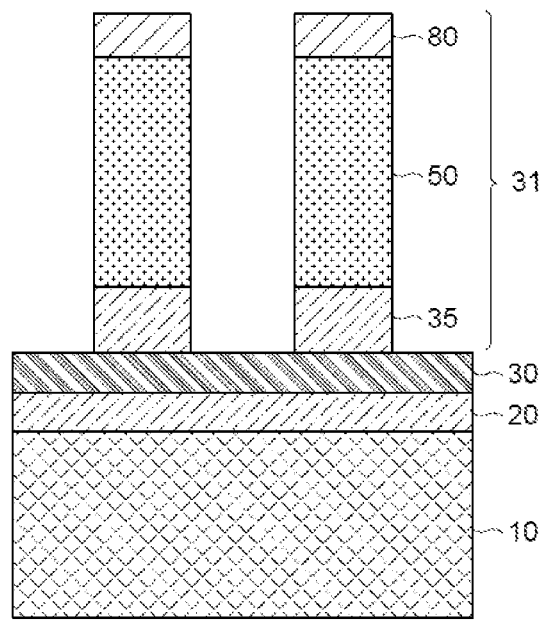

Next, refer to FIG. 8, it illustrates the cross-sectional view after the third step of manufacturing the vacuum tube nonvolatile memory according to an example embodiment of the present invention. The second dielectric layer 35, gate layer 50 and hard mask layer 80 are patterned to form a gate structure 31. The patterning can be achieved by conventional silicon patterning technology such as photolithography.

Figure 9:
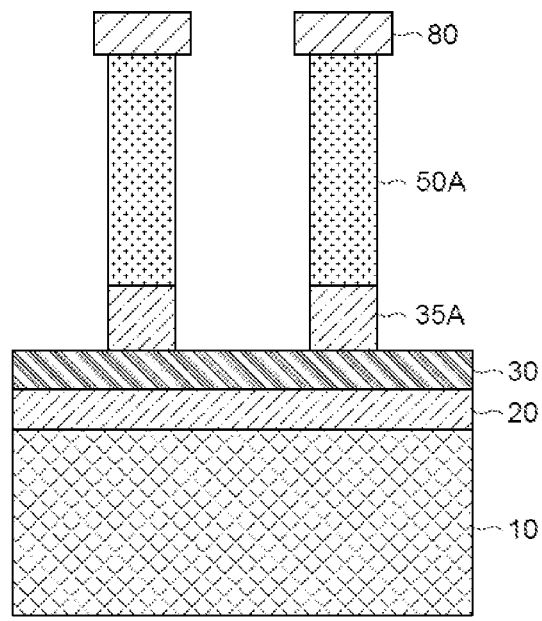

Next, refer to FIG. 9, it illustrates the cross-sectional view after the fourth step of manufacturing the vacuum tube nonvolatile memory according to an example embodiment of the present invention. The second dielectric layer 35a and gate layer 50a of the gate structure 31 are selectively etched to trim the width of the remaining gate layer 50a smaller than that of the hard mask layer 80. The selective etching can be achieved by using fluoride containing plasma to trim the gate layer 35a and using BOE or DHF to trim the second dielectric layer 35a of the gate structure 31.

Figure 10:
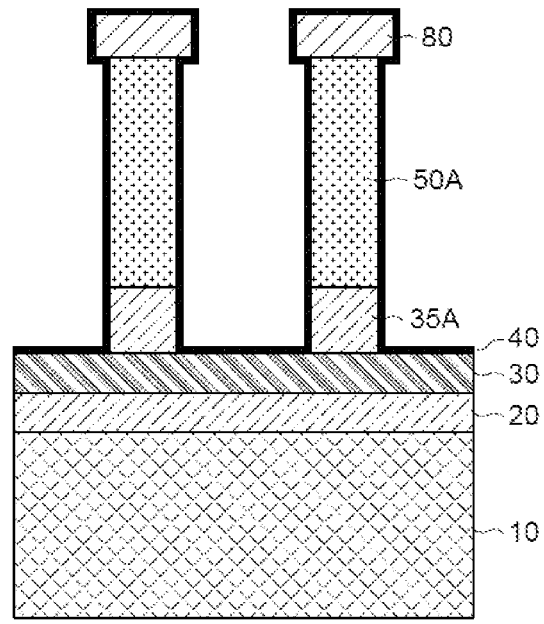

Next, refer to FIG. 10, it illustrates the cross-sectional view after the fifth step of manufacturing the vacuum tube nonvolatile memory according to an example embodiment of the present invention. A gate dielectric layer 40 is conformally formed on the entire substrate 10. In one embodiment, the gate dielectric layer is oxide, oxynitride, silicon nitride, $Al_2O_3$, AlN or HfO, deposited by CVD, MOCVD, ALD technologies.

Figure 11:
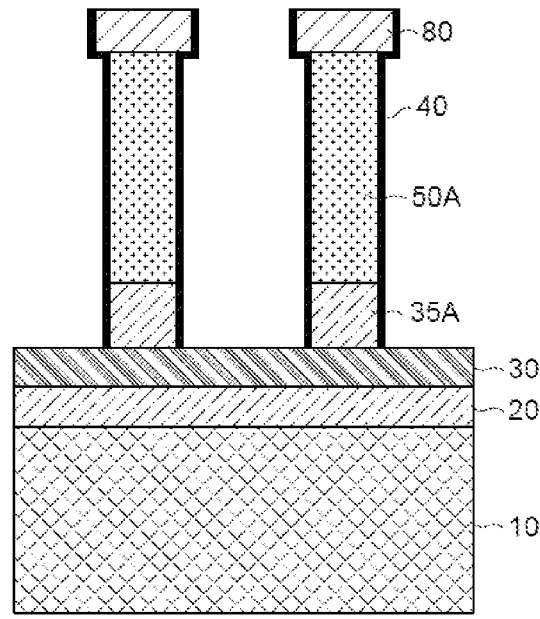

Next, refer to FIG. 11, it illustrates the cross-sectional view after the sixth step of manufacturing the vacuum tube nonvolatile memory according to an example embodiment of the present invention. The gate dielectric layer 40 exposed on the substrate surface is etched away to leave the remaining gate dielectric layer 40 formed the sidewalls of the gate structure 31 as shown in the Figure.

Figure 12:
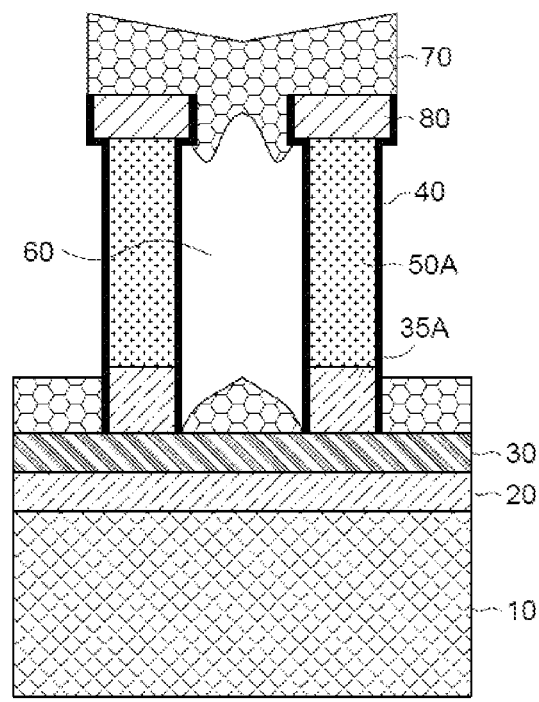

Next, refer to FIG. 12, it illustrates the cross-sectional view after the seventh step of manufacturing the vacuum tube nonvolatile memory according to an example embodiment of the present invention. A drain layer 70 is formed on the entire substrate 10. In one embodiment, the drain layer 70 is the metal materials include Zr, V, Nb, Ta, Cr, Mo, W, Fe, Co, Pd, Cu, Al, Ga, In, Ti, TiN, TaN, diamond or the combination of these materials. In one embodiment, the source layer is deposited by CVD, PVD or sputtering technologies. The vacuum area 60 is formed by sealing the gate 50 and source 30 and drain areas 70. In one embodiment, the pressure in the vacuum area 60 is in the range of 0.1 torr~50 torr.

Figure 13:
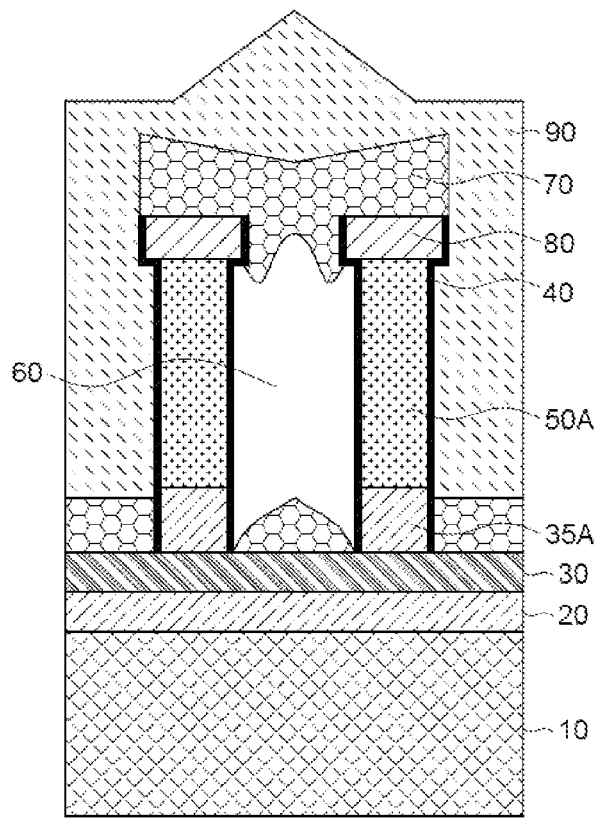

Next, refer to FIG. 13, it illustrates the cross-sectional view after the eighth step of manufacturing the vacuum tube nonvolatile memory according to an example embodiment of the present invention. An interlayer dielectric (ILD) layer 90 is formed on the entire substrate 10. In one embodiment, the ILD layer 90 is silicon dioxide deposited by CVD, PECVD, HDP CVD technologies.

Figure 14:
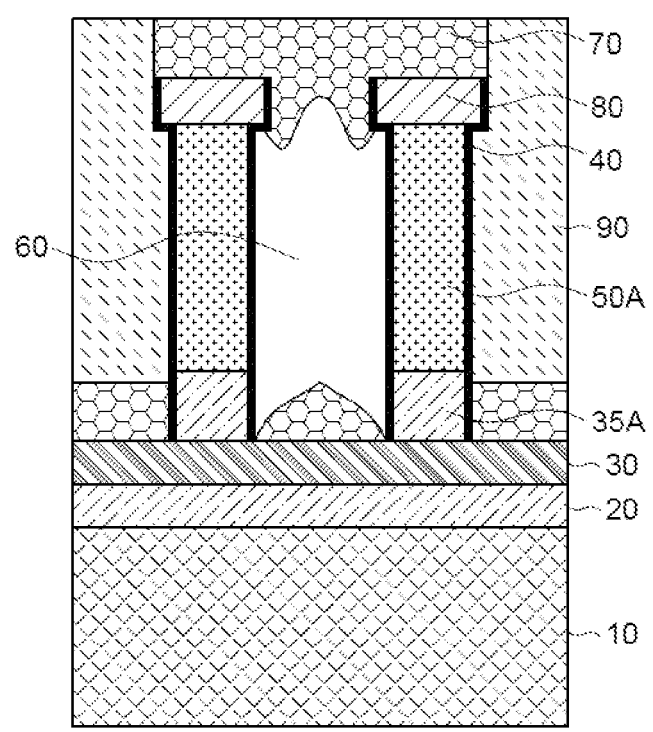

Next, refer to FIG. 14, it illustrates the cross-sectional view after the ninth step of manufacturing the vacuum tube nonvolatile memory according to an example embodiment of the present invention. The ILD layer 90 is planarization first, then the source 30 and drain 70 layers are annealed to turn them into a cylindrical shape as shown in the Figure. The step can improve the reliability of the vacuum tube nonvolatile memory since it can reduce the stress of the source 30 and drain 70 areas. In one embodiment, the planarization process can be the conventional chemical mechanical polishing (CMP) or etch back. In one embodiment, the anneal process is performed in the environment such as He, $N_2$, Ar or $H_2$ in the temperature range of 600~1000° C., preferably in 800° C.

According to the description above, the present invention disclosed a vacuum tube nonvolatile memory and the method of manufacturing it. The nonvolatile memory is a Metal-ONO-Vacuum Field Effect Transistor Charge Trap Nonvolatile Memory using standard silicon semiconductor processing. The source and drain were separated and replaced by low electron affinity conducting material, with the curvature of the tip controlled by the thermal reflow of the source metal material. An ONO gate dielectric with a nitride charge-trap layer to provide a blocking insulating between the gate electrode and the vacuum channel. The present structure exhibits superior program and erase speed as well as the retention time. It also provides with excellent gate controllability and negligible gate leakage current due to adoption of the gate insulator.

While various embodiments in accordance with the disclosed principles has been described above, it should be understood that they are presented by way of example only, and are not limiting. Thus, the breadth and scope of exemplary embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A method of forming a vacuum tube nonvolatile memory, comprising the steps of:
   providing a substrate;
   sequentially forming a dielectric layer, a source layer, a second dielectric layer, a gate layer and a hard mask layer on said substrate;
   patterning said second dielectric layer, said gate layer and said hard mask layer to form a gate structure;
   trimming said second dielectric layer, said gate layer of said gate structure to make the width of said second dielectric layer and said gate layer smaller than the width of said hard mask layer;
   forming a gate dielectric layer on said substrate, and performing etching to form gate dielectric layer sidewalls;
   forming a drain layer; and
   forming an interlayer dielectric layer and performing planarization to form a vacuum channel.

2. The method according to claim 1, further comprising annealing said source layer and said drain layer.

3. The method according to claim 2, wherein said annealing is performed in the environment of He, $N_2$, Ar or $H_2$.

4. The method according to claim 2, wherein said annealing is performed in the temperature range of 600~1000° C.

5. The method according to claim 1, wherein the pressure in said vacuum channel is in the range of 0.1 torr~50 torr.

6. The method according to claim 1, wherein said source layer and said drain layer are the metal materials selected from the group consisting of Zr, V, Nb, Ta, Cr, Mo, W, Fe, Co, Pd, Cu, Al, Ga, In, Ti, TiN, TaN, diamond and the combination of these materials.

7. The method according to claim 1, wherein said gate layer is the metal materials comprising Al, poly Si, Cu, Ga, In, Ti, Ta, W, Co, TiN, TaN, or the combination of these materials.

8. The method according to claim 1, wherein said gate dielectric layer is the metal materials comprising oxide, oxynitride, silicon nitride, $Al_2O_3$, AlN and HfO.

9. The method according to claim 1, wherein said hard mask layer is the metal materials comprising oxynitride, silicon nitride, and TiN.

* * * * *